United States Patent [19]
Matsuoka

[11] Patent Number: 5,994,002
[45] Date of Patent: Nov. 30, 1999

[54] PHOTO MASK AND PATTERN FORMING METHOD

[75] Inventor: Koji Matsuoka, Hirakata, Japan

[73] Assignee: Matsushita Electric Industrial Co., Ltd., Osaka, Japan

[21] Appl. No.: 08/923,194

[22] Filed: Sep. 4, 1997

[30] Foreign Application Priority Data

Sep. 6, 1996 [JP] Japan .................................. 8-236317

[51] Int. Cl.⁶ .................................................... G03F 9/00
[52] U.S. Cl. ............................................................ 430/5
[58] Field of Search .............................. 430/5, 322, 323; 359/559

[56] References Cited

U.S. PATENT DOCUMENTS 5,546,225  8/1996  Shiraishi ...................... 359/559
5,573,890  11/1996  Spence ........................ 430/311

FOREIGN PATENT DOCUMENTS 8-51068  2/1996  Japan .

Primary Examiner—S. Rosasco
Attorney, Agent, or Firm—Pearne, Gordon, McCoy & Granger LLP

[57] ABSTRACT

A resist pattern is formed with a phase-shifting mask 4 in which transparent regions through an opaque region are different 180° in phase from one another. In this case, when positive resist 1 is subjected to exposure, the widths of the opaque regions 5A and 5B of the mask 4 are changed according to a pattern adjacent thereto, so that a fine pattern having the same line width is formed with high accuracy.

14 Claims, 9 Drawing Sheets

PHOTO MASK AND PATTERN FORMING METHOD

BACKGROUND OF THE INVENTION

This invention relates to the formation of a fine pattern by a lithography process in the manufacturing of a semiconductor integrated circuit.

A recent tendency of semiconductor devices is to make the design rule as fine as possible, and semiconductor chips of the order of 0.25 μm have been available in market. According to this tendency, in the lithography the exposure wave length, being decreased, has been changed from g-line (436 nm) through i-line (365 nm) to KrF excimer laser (248 nm). A stepper using an ArF excimer laser (193 nm) has been developed for the next generation lithography. However, the development is retarded because the lens material absorbs the ultra short wave light beam such as ArF excimer laser beam. In the circumstances, in the lithographic technique using the KrF excimer laser, research is conducted on ultra resolution technique.

In general, the limit resolution of optical lithography according to a reduction projection exposure method is proportional to the exposure wave length, and inversely proportional to the numerical aperture of the projection lens. The formation of a pattern of the order of 0.3 μm has been achieved by using a KrF excimer laser (a wave length of 148 nm) and a projection lens whose numerical aperture is 0.4 to 0.5.

One of the ultra resolution techniques which improve the resolution limit in the reduction projection exposure method, is a method using an alternating phase-shifting mask (Levenson phase-shifting mask).

An example of the formation of a pattern which uses a conventional alternating phase-shifting mask, will be described.

FIGS. 8A through 8C are sectional views showing a pattern forming method using a conventional alternating phase-shifting mask. In those figures, reference numeral 21 designates a positive resist; 22, a substrate; 23A and 23B, exposure light beams; 24, a phase-shifting mask; 25, opaque regions; and 26A and 26B, transparent regions (transparent regions). The transparent regions 26B are shifted 180° in the phase of the exposure light beams 23 with respect to the transparent regions 26A. The exposure light beam 23A irradiates the mask 24, and the exposure light beam 23B passed through the transparent regions of the mask are imaged onto the resist 21.

As shown in FIG. 8A, first the substrate 22 is coated with the positive resist 21. The latter 21 is a chemical amplification type resist for a KrF excimer laser, and it is applied to the substrate 22 to a thickness of 0.5 micron. Next, the positive resist is subjected to exposure through the phase-shifting mask 24.

The exposure conditions of the exposure device (or stepper) are an exposure wave length λ=248 nm, a numerical aperture NA=0.48, coherent factor a σ=0.30. The alternating phase-shifting mask is of quartz. As shown in FIG. 8B, the quartz are ground in correspondence to the transparent regions 26B. The light beams passing through the transparent regions 26B are inverted 180° in phase with respect to the light beams passing through the transparent regions 26A.

First, the exposure light beam 23A irradiates the mask 24, and diffracted according to the pattern density. In the case of the alternating phase-shifting mask, the transparent regions on both sides of each opaque region are different 180° in phase from each other, and therefore with a period pattern the zero-th order and even-number-th order light beams are canceled out. On the other hand, the odd-number-th order light beams such as ± first, third, and fifth orders light beams are generally diffracted at an angle which is half of that in usual mask. In general, the angle of a light beam passed through a projection lens is finite, and therefore the pattern resolution is a pattern period which can pass through the mask. In the alternating phase-shifting mask, in general the light beam is diffracted at an angle which is half of that of the usual mask, and therefore ideally a high resolution two times the usual mask is obtained.

In order to obtain a high resolution with an alternating phase-shifting mask, it is necessary to arrange spatial optical phases (to increase the coherency). The unit indicating the degree of coherency is the ratio (coherent factor) σ of the NA of the projection lens to the NA of the irradiation system. As the ratio a is decreased, the optical coherency is increased. In general, in the case where the mask is irradiated with the stepper, the coherent factor (σ) is of the order of 0.5 to 0.8; however, in the case where the alternating phase-shifting mask is employed, the coherent factor is of the order of 0.2 to 0.4.

After the pattern exposure as shown in FIG. 8B, a PEB (post exposure baking) processing is carried out, and a developing processing is performed with an ordinary alkaline solution for sixty (60) seconds, to form a resist pattern (FIG. 8C). According to this pattern forming method, a line and space pattern of 0.16 μm is obtained which is much smaller than the exposure wave length 248 nm (0.248 μm). In general, the alternating phase-shifting mask is effective in obtaining a fine periodical pattern. Hence, research has been conducted on the application of it to a DRAM device.

However, the alternating phase-shifting mask suffers from the following problems: Even if patterns are equal in line width, adjacent patterns are different in distance from one another, then the resist dimension projected onto the wafer is changed. Hence, although the dimensional control of the line width of the gate pattern of a logic device is considerably important, the logic device includes a number of random patterns, and therefore the application of the alternating phase-shifting mask has not been very studied.

In FIG. 8C, a pattern 21X and a pattern 21Y are resist patterns which are obtained by transferring light through a mask pattern which is so designed that the former 21X is a 0.16 μm line and space pattern and the latter 21Y is a 0.16 μm line/0.48 μm space pattern. In this case, the actual dimensions of the resist pattern transferred onto the wafer are as follows: The pattern 21X is 0.16 μm, while the pattern 21Y is 0.20 μm, and therefore, the difference between those two patterns is 0.04 μm. In the formation of an ordinary transistor gate, in general its tolerance is ±10% of a line width. Hence, in the case of a line width of 0.16 μm, the tolerance must be within 0.03 μm. Accordingly, the pattern forming method using the conventional phase-shifting mask is not applicable to the pattern formation of the transistor gate which must be considerably high in dimensional accuracy.

SUMMARY OF THE INVENTION

Accordingly, an object of the invention is to eliminate the above-described difficulties accompanying a conventional pattern forming method. More specifically, an object of the invention is to provide a fine pattern forming method which uses a phase-shifting mask, and the resultant line width is less in variation, and the phase-shifting mask.

The following fact has been found with the mask formation using the alternating phase-shifting mask: In the case where the distances between adjacent patterns are different, even if the line widths are equal to one another, then the dimensions of the resist patterns transferred on the wafer are changed, and this phenomenon is due to an optical proximity effect. And it has been found that the abovedescribed phenomenon is remarkable in the region where the distances between adjacent patterns are of a normalized value, and 1.0 $\lambda$/NA or less.

In a photo mask of the invention, transparent regions on both sides of an opaque region are different 180° in phase from one another. The photo mask is used to subject resist to exposure to form a resist pattern corresponding to the opaque region. In the photo mask, according to the invention, the line width of the opaque region is corrected according to the a distance to an adjacent pattern.

In another photo mask of the invention, transparent regions on both sides of an opaque region are different 180° in phase from one another. The photo mask is used to subject positive resist to exposure to form line patterns having an identical line width. In the photo mask, according to the invention, another opaque region is provided between the two adjacent above-mentioned opaque regions which form resist patterns a distance of which is a predetermined value or more.

In a pattern forming method of the invention, the aforementioned photo mask is employed, so that the intensity of light passed through the photo mask or the optical profile is changed. Since a particular pattern space is eliminated, even with the line patterns different in space, their width distributions are determined according to their own threshold values; that is, the resultant resist pattern has line widths which are substantially equal.

DETAILED DESCRIPTION OF THE PREFERRED EMBODIMENTS

A pattern forming method, which constitutes an embodiment of the invention, will be described with reference to the accompanying drawings.

First, the fact that, in a pattern forming method using a alternating phase-shifting mask (Levenson phase-shifting mask), an optical proximity effect increases variation in line width, will be described.

In the periodical pattern forming method using an alternating phase-shifting, near the resolution limit, only ± primary light is imaged. This optical intensity distribution is of a sine wave. Especially, with a pattern frequency which is provided until, after all primary light beams have been applied, a tertiary light beam is applied, the optical intensity is constant (the sine wave amplitude is not changed), and the pattern pitch (the sine wave period) is increased. Therefore, in this case, a pattern line width is greatly changed. This is corresponding to a region of having a steep slop at a portion less than the normalized pattern space width 1.0 $\lambda$/NA in FIG. 5B. This is an optical proximity effect peculiar to the alternating phase-shifting mask. With the alternating phase-shifting mask, the dimension is greatly changed in a small range when compared with an ordinary mask. The inventors have found this phenomenon, and decreased the fluctuation in pattern line width by correcting portions whose pattern space is smaller than the normalized space width 1.0.

First Embodiment

Figure 1A:
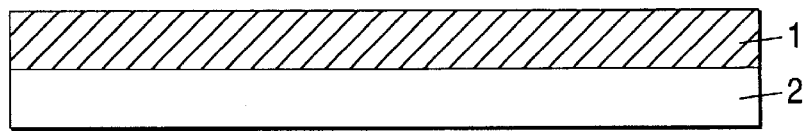
FIGS. 1A through 1C are sectional views for a description of steps in a pattern forming method, which constitutes a first embodiment of the invention.
Figure 1B:
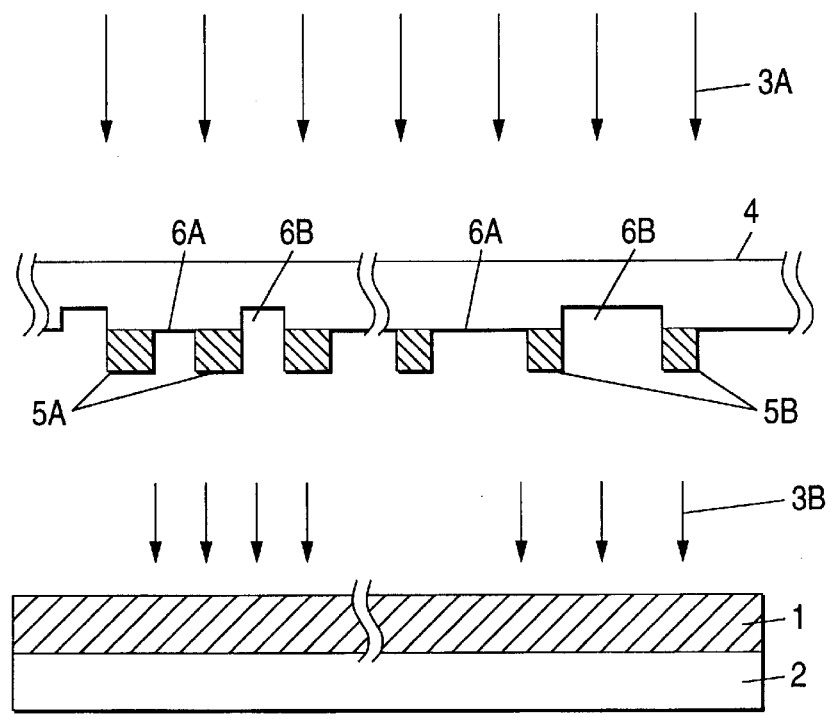
Figure 1C:
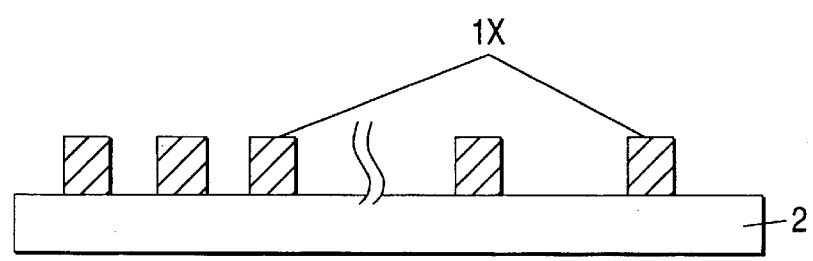
Figure 2:
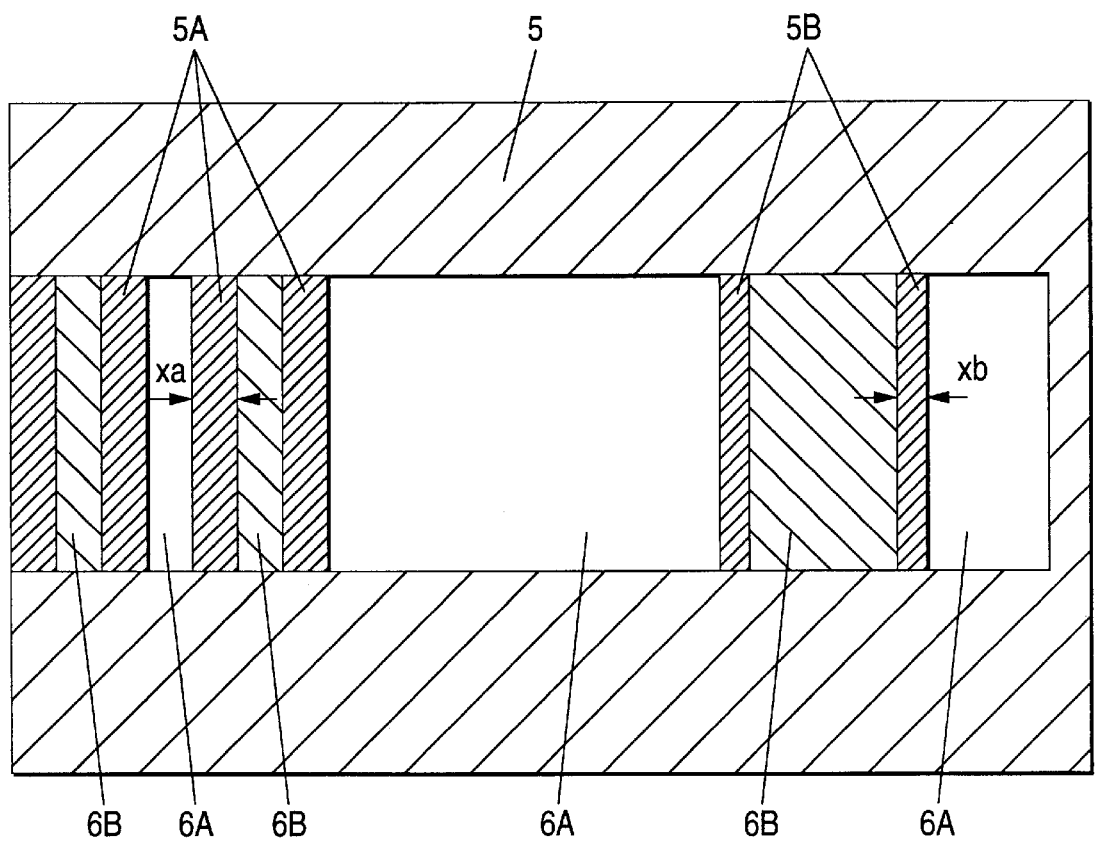
FIG. 2 is a diagram showing the structure of a mask used in the pattern forming method, the first embodiment of the invention.
Figure 3A:
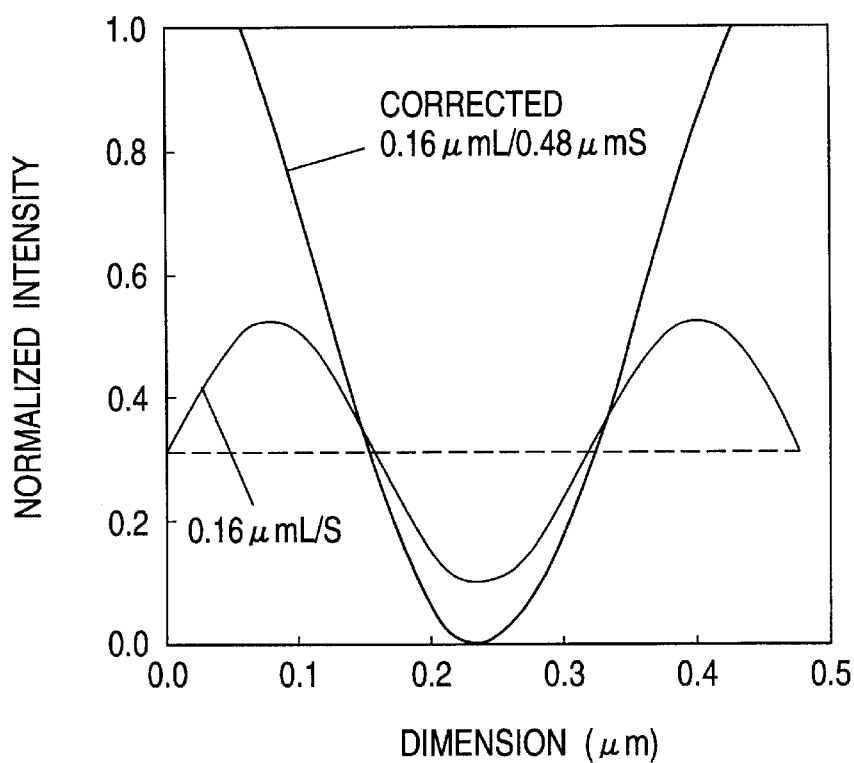
FIGS. 3A and 3B are graphical representations indicating optical intensity distributions in the pattern forming method the first embodiment of the invention.
Figure 3B:
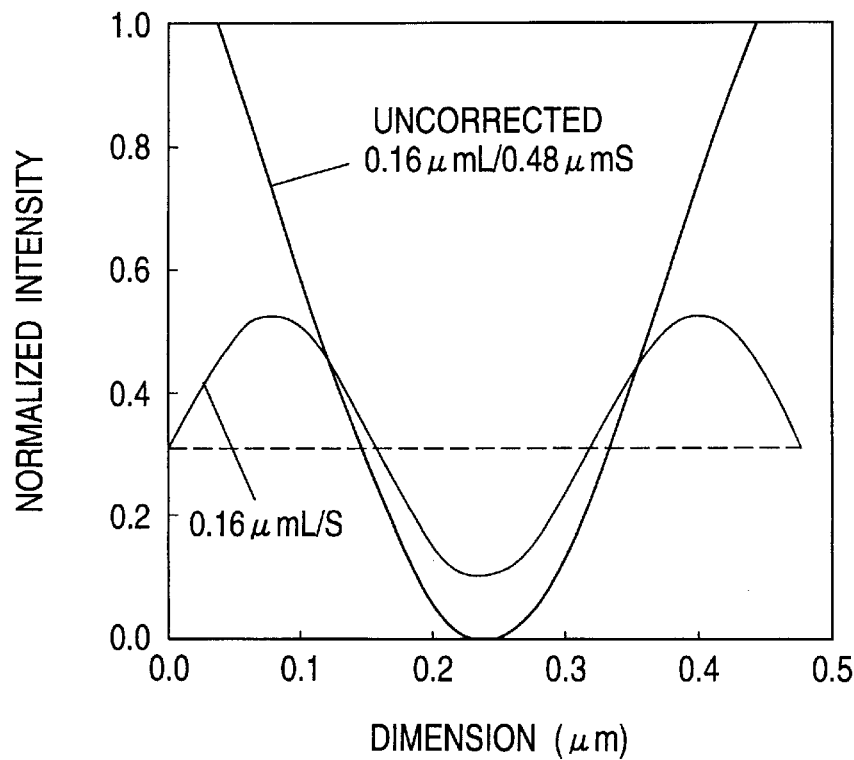

FIGS. 1A through 1C are sectional views showing pattern forming steps in a pattern forming method, which constitutes a first embodiment of the invention. FIG. 2 is a diagram of a part of a phase-shifting mask in the first embodiment as viewed from the wafer side. FIGS. 3A and 3B show optical intensity distributions on a resist layer.

In FIGS. 1A through 1C, and 2, reference numeral 1 designates a positive resist; 2, a substrate; and 3A and 3B, exposure light beams. The exposure light beam 3A is to irradiate a mask; and the exposure light beam 3B is passed through the mask and imaged on the resist. Further in those figures, reference numeral 4 designates a photo mask; 5 (5A and 5B), opaque regions; and 6A and 6B, transparent regions. The transparent region 6B inverts the phase of the exposure light beam 180° with respect to the transparent region 6A.

Now, the pattern forming method according to the invention will be described with reference to the drawings.

As shown in FIG. 1A, the surface of the substrate 2 is coated with the positive resist 1. The resist is a KrF chemical amplification type positive resist, and it is applied thereto to a thickness of 0.5 $\mu$m. In FIG. 1B, the exposure light beam 3A is applied to the phase-shifting mask 4. The exposure light beam 3B passed through the mask is applied to the photo resist 1. The stepper's exposure conditions are as follows: exposure wave length $\lambda$=248 nm, numerical number NA=0.48, and coherent factor $\sigma$=0.40. A 1/5 reduction type projection exposure device is employed. The phase-shifting mask 4 is used that of a type in that the quartz substrate is ground to change 180° the phase.

The phase-shifting mask shown in FIG. 1B will be described with reference to FIG. 2 in more detail. In FIG. 2, the opaque regions 5A and 5B are regions where fine resist patterns are formed on the wafer. In FIG. 2, reference characters xa and xb denote the widths of the regions 5A and 5B, respectively. The opaque region 5A is a region where a 0.16 $\mu$m line and space pattern is formed; and the opaque region 5B is a pattern region of 0.16 $\mu$m line/0.48 $\mu$m space interval. Those regions 5A and SB are on one and the same mask. Exposure is carried out with a 1/5 reduction stepper, so that the mask pattern is contracted to 1/5 when transferred onto the wafer. Hence, the mask dimension of FIG. 1B is five times as large as the resist pattern dimension which is actually transferred thereon. In the embodiment, the width xa of the opaque region is 0.80 μm, and the width xb of the opaque region 5B is 0.50 μm.

FIG. 3A is a graphical representation indicating the spatial optical intensities of light on the mask which passed through the mask which has been dimension-corrected as shown in FIG. 2. FIG. 3B is also a graphical representation indicating the spatial optical intensities of light passed through the mask which is not corrected (the opaque region of the mask being 0.80 μm according to the pattern dimension). In each of FIGS. 3A and 3B, the broken line indicates the optical intensity with which, by adjusting the amount of exposure, the 0.16 μm line and space is formed as 1:1. The resist is positive resist, and therefore a resist pattern is formed in the region below the broken line. Hence, the line width of the resist pattern thus formed corresponds to the optical intensity distribution width cut with the broken line. In the case of FIG. 3A, with a 0.16 μm line/0.48 μm space pattern, a resist pattern of 0.171 μm is formed. In the case of FIG. 3B, with the mask uncorrected, the resist pattern will be 0.190 μm. As was described above, by adjusting the width of the phase-shifting mask's opaque region, the optical intensity on the wafer is changed, so that the dimension thereof can be adjusted.

The resist exposed with the above-described optical intensity as shown in FIG. 1C is subjected to PEB (post exposure baking), and then developed with alkaline solution for sixty (60) second, to form resist patterns 1x. In the embodiment, resist patterns 0.16 μm in line width are formed with high dimensional accuracy of ±10%.

As was described above, in the first embodiment, by changing the width of the opaque region of the phase-shifting mask, the same line widths which are different in pattern space, can be formed with high accuracy. In summary, a line width of the opaque region is corrected according to a distance to an adjacent pattern. More specifically, a first one of the opaque regions is reduced uniformly along a length of the first opaque region, the width being reduced as a function of a distance from the first opaque region to a second one of the opaque regions, the second opaque region being adjacent and parallel to the first opaque region.

Second Embodiment

Figure 4:
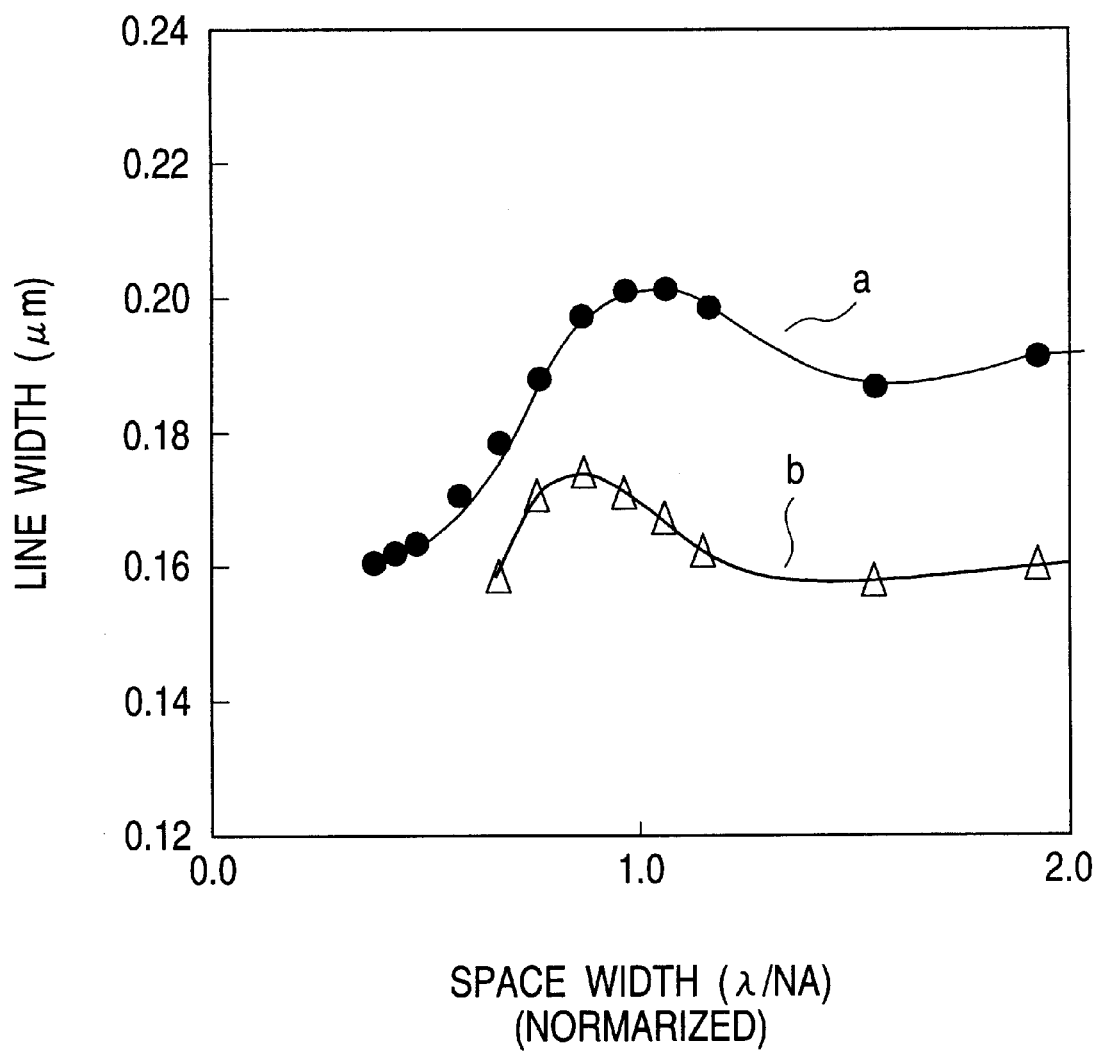
FIG. 4 is a graphical representations indicating line widths with pattern spaces in a pattern forming method, which constitutes a second embodiment of the invention.

A second embodiment of the invention will be described with reference the accompanying drawings. FIG. 4 is a graphical representation obtained by an optical intensity simulation method, indicating 0.16 μm line widths and pattern spaces, in the case where a phase-shifting mask in that the transparent regions on both sides of an elongated opaque region are different 180° in phase from each other is employed for a positive resist. The simulation conditions are as follows: exposure wave length λ=248 nm, numerical number NA=0.60, and coherent factor σ=0.3. The threshold optical intensity is set to the value with which the 0.16 μm line and space pattern is 1:1.

In FIG. 4, the curve a (black dots) is for the case where the mask is not corrected, and the widths of the opaque regions (on the masks of) all the patterns, being converted into values on the wafers (opaque width x contraction ratio) are 0.16 μm equal to that of the resist pattern. On the other hand, the curve b (white triangles) is such that, in patterns in which adjacent pattern spaces in design are normalized value 0.67 λ/NA or more, the opaque region width on the mask is set to 0.10 μm being converted those on the wafer.

It can be understood that, by correcting the width of the mask's opaque regions, the difference between the maximum line width and the minimum line width is reduced to substantially half.

The reason why the mask correction is carried out for the patterns whose adjacent patterns is 0.67 λ/NA or more will be described below.

When a mask correction is given to a pattern in which the adjacent pattern space is 0.67 λ/NA or less, then as is seen from the curve b (white triangle) in FIG. 4 the line width of the actual pattern is smaller than 0.16 μm. That is, the case where no mask correction is given to a pattern in which the adjacent pattern space is 0.16 λ/NA or less, the resultant pattern is close to the designed dimension 0.16 μm. Hence, it is preferable that the mask correction is given to a pattern in which the adjacent pattern space is 0.16 λ/NA or more.

As is apparent from the above description, in the second embodiment, the opaque region of a mask in which the pattern space designed is 0.16 λ/NA or more is determined 0.10 μm as a conversion value on the wafer, and the opaque region of the mask in which the pattern space designed is 0.67 λ/NA or less is determined 0.16 μm; that is, two different opaque region widths are provided on the mask. This feature makes it possible to halve the amount of fluctuation in the line width of the resist pattern.

In the second embodiment, the width of the opaque region is changed with the pattern space of 0.67 λ/NA as a threshold value. However, the same effect may be obtained when the opaque region of the mask pattern of the region in which the pattern space is 0.5 λ/NA or less, and the opaque region of the mask pattern of the region in which the pattern space is 0.7 λ/NA or more are made different in width from each other.

Third Embodiment

Figure 5A:
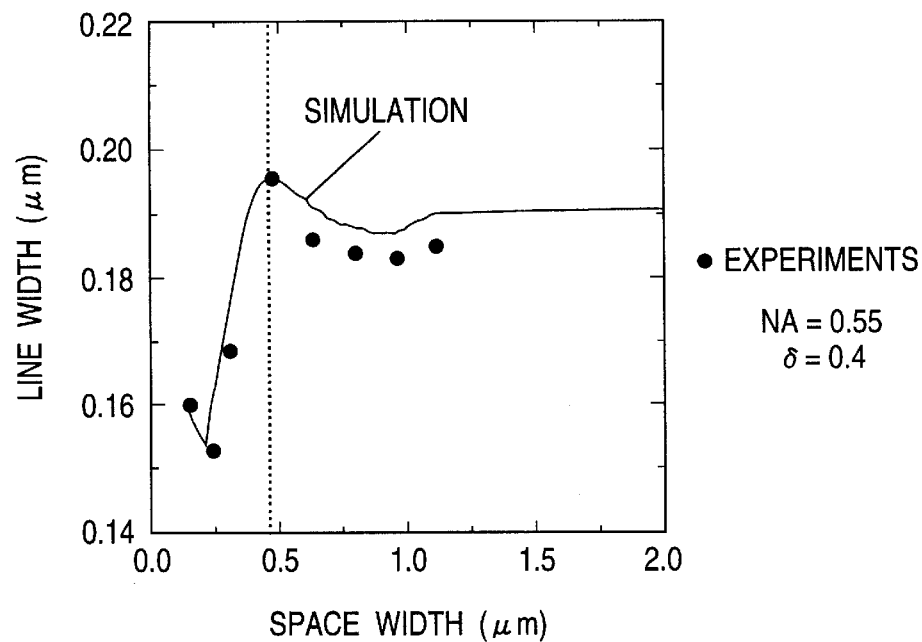
FIGS. 5A and 5B are graphical representations indicating line widths with pattern spaces in a pattern forming method, which constitutes a third embodiment of the invention.
Figure 5B:
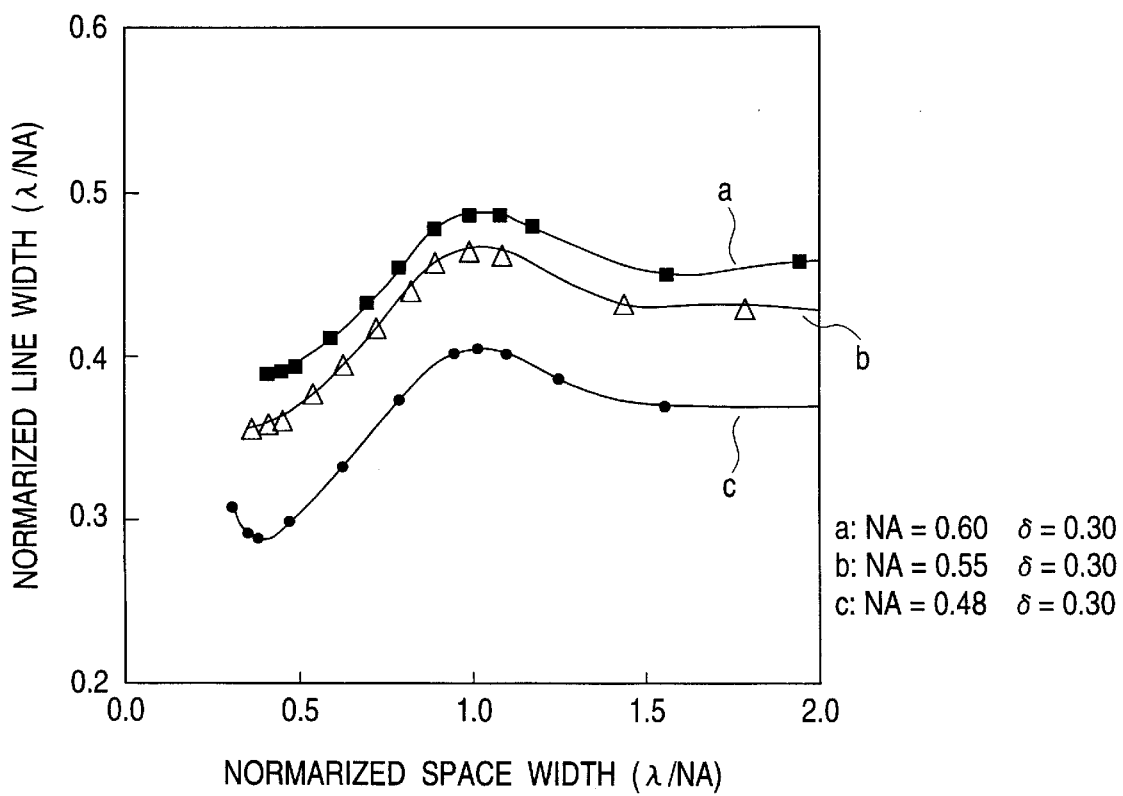

A third embodiment of the invention will be described with reference the accompanying drawings. FIG. 5A and 5B are graphical representations obtained by a optical intensity simulation method and an experimentation, indicating line widths with pattern spaces in the case where a phase-shifting mask in that the transparent regions on both sides of an elongated opaque region are different 180° in phase from each other is employed for a positive resist. In FIG. 5B, the pattern line widths and the pattern spaces are normalized by λ/NA. In FIG. 5, a curve a indicates a case of NA=0.60; a curve b, NA=0.55; and a curve c, NA=0.48. In these cases, a coherent factor a is 0.30.

As is seen from FIG. 5, each of the line widths is abruptly increased when the normalized value is from 0.5 to 1.0, and largest when it is near 1.0, and decreases gradually as it is increased.

Let us consider the curves a, b and c in FIG. 5B. When the pattern space is 0.4 λ/NA, the normalized line width is minimum; and when it is 1.0 λ/NA, the normalized line width is maximum. Thereafter, as the pattern spaces increases, the line width is gradually decreased. Hence, in order to suppress the fluctuation of the line width, the region should not be used in which adjacent pattern space is 0.65 λ/NA or less.

In fact, a design rule was so determined that there was no pattern space of 0.7 λ/NA. And with the exposure wave length λ=248 nm, the numerical aperture NA=0.48, and the coherent factor σ=0.41, the ⅕ reduction type projection exposure device (stepper) was employed to subject a resist pattern of 0.16 μm to exposure. The dimensional fluctuation obtained with the phase-shifting mask was limited to 0.16 μm ±10%.

As was described above, by limiting adjacent pattern spaces on the wafer to 0.65 λ/NA or more, the dimensional fluctuation is limited.

Fourth Embodiment

A fourth embodiment of the invention will be described with reference to the accompanying drawings.

Figure 6A:
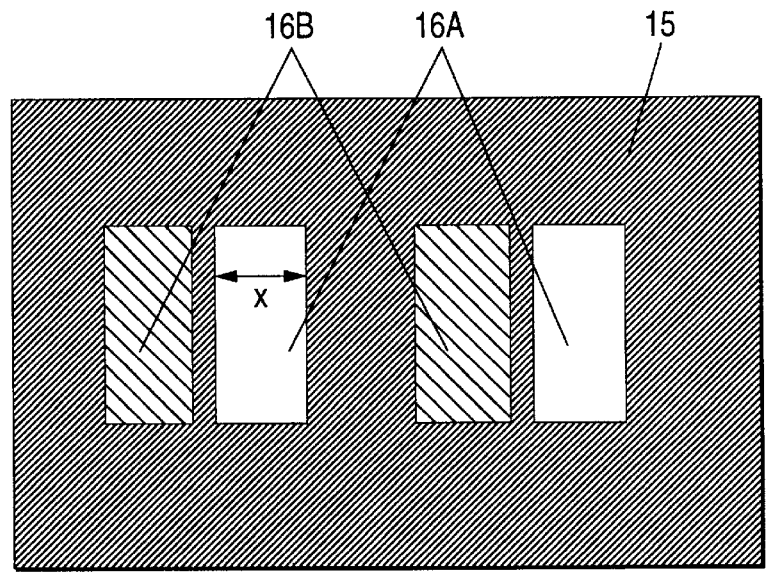
FIGS. 6A through 6C are diagrams for a description of a pattern forming method, which constitutes a fourth embodiment of the invention.
Figure 6B:
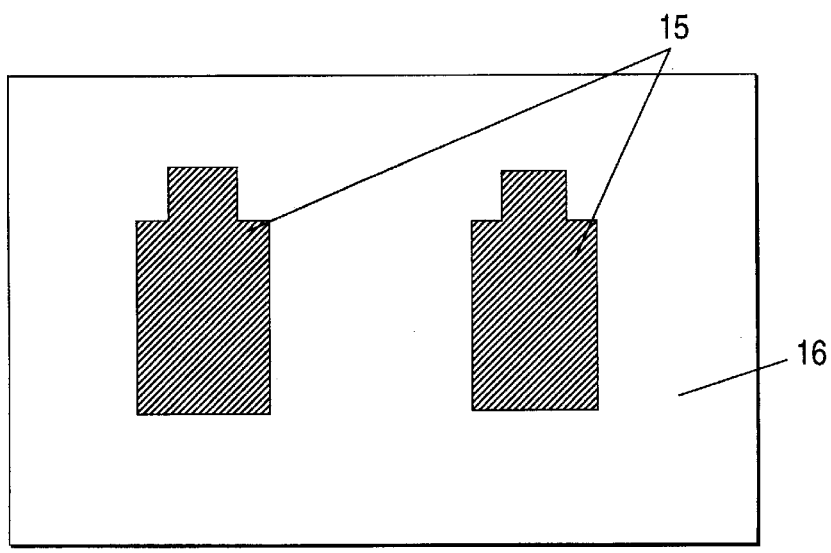
Figure 6C:
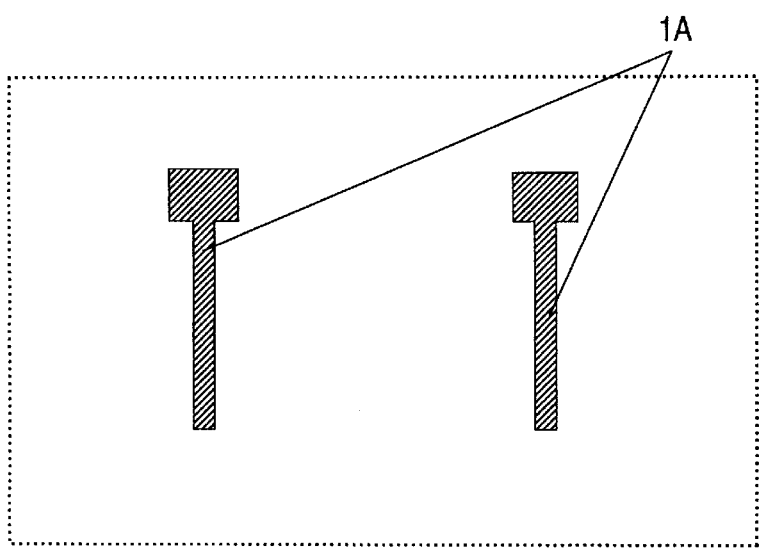

FIG. 6A is a diagram showing a part of a mask of the embodiment as viewed from the side of the wafer. FIG. 6B is a diagram of a mask used for the second exposure in the embodiment. FIG. 6C is a diagram showing a resist pattern transferred by the second exposure.

Figure 9A:
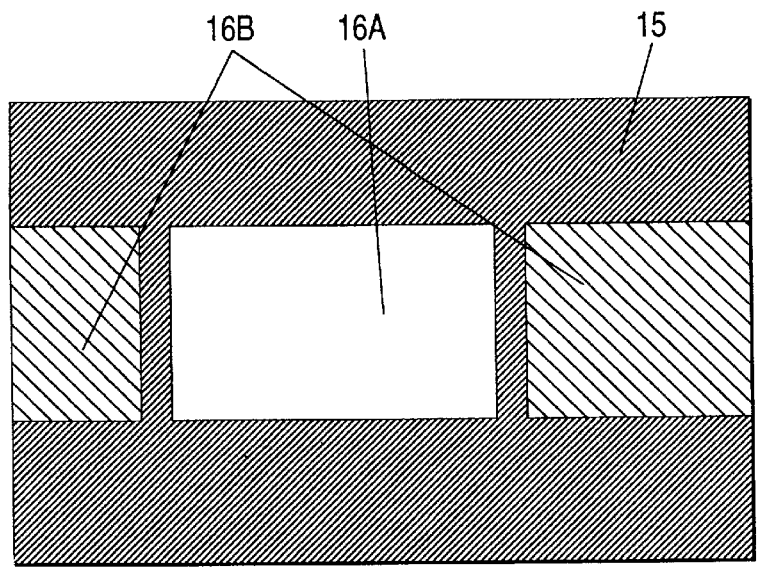
FIGS. 9A through 9C are diagrams for a description of the conventional pattern forming method.
Figure 9B:
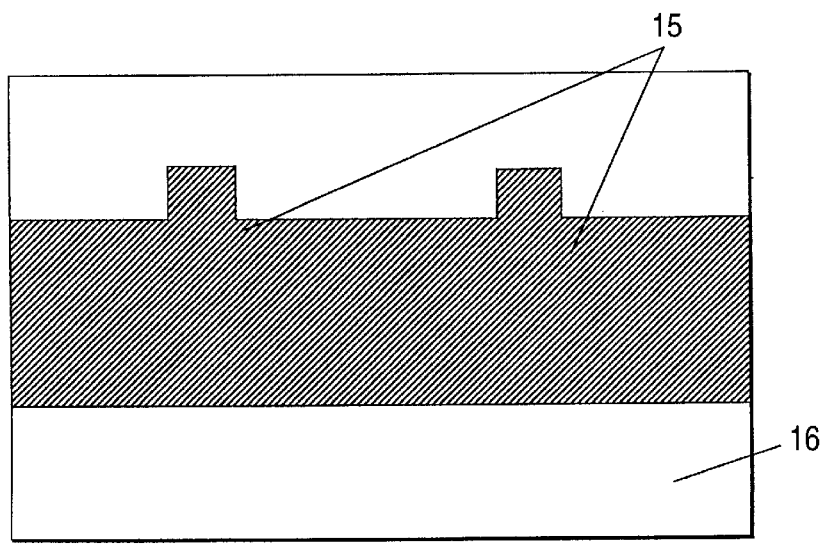
Figure 9C:
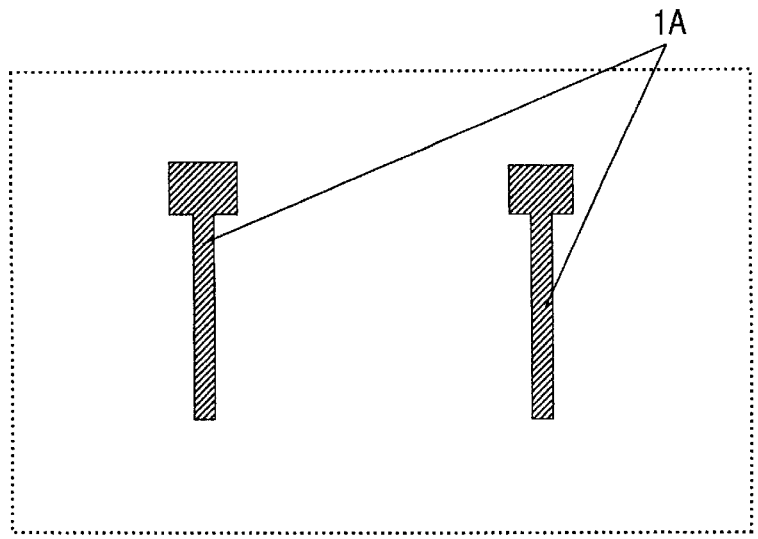

FIG. 9A is a diagram showing a part of a conventional phase-shifting mask as viewed from the side of the wafer. FIG. 9B is a diagram showing a mask used for the second exposure in the prior art. FIG. 9C is a diagram showing resist patterns.

Figure 7:
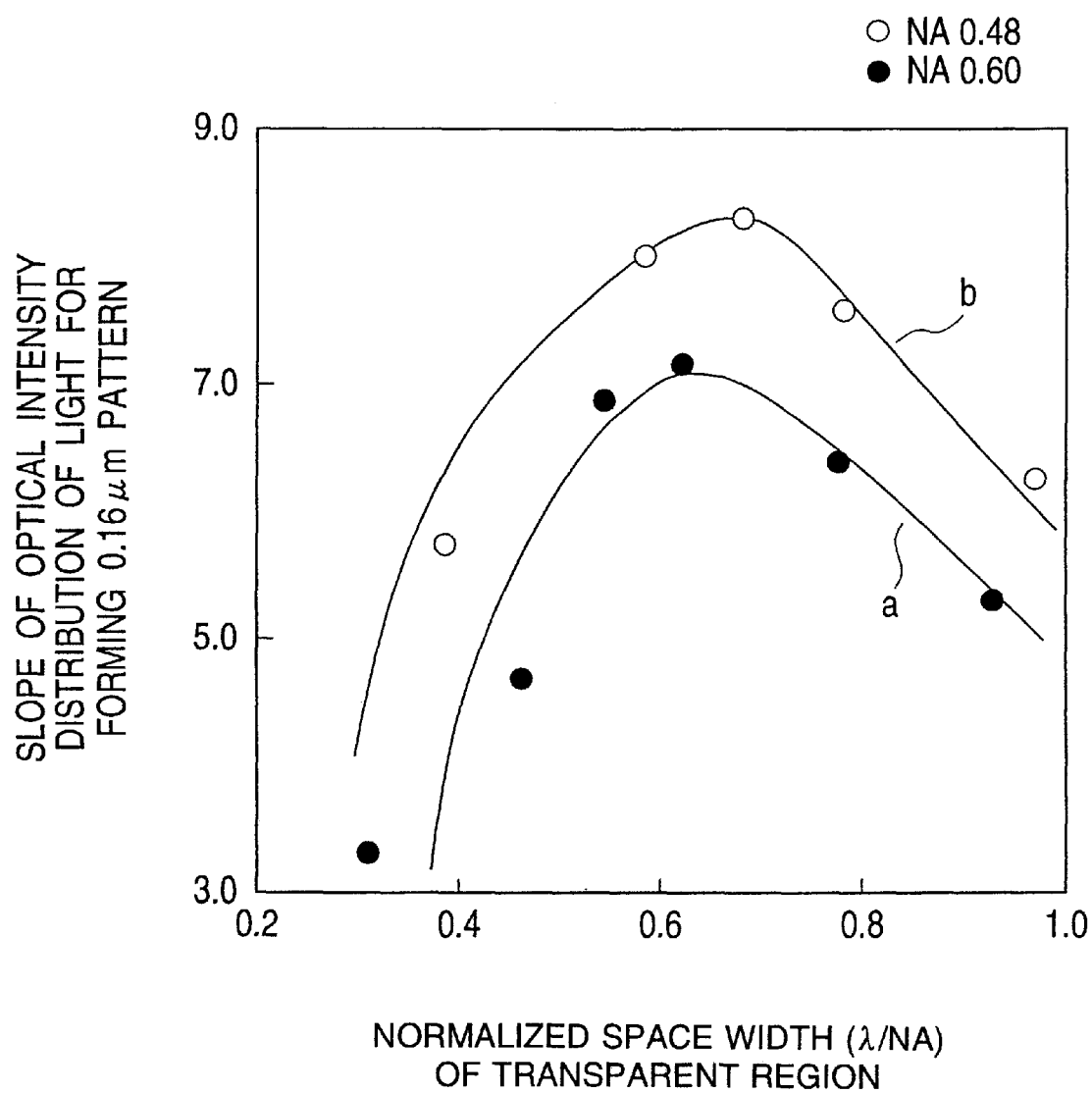
FIG. 7 is a graphical representation indicating transparent regions with optical intensity distributions in the pattern forming method, the fourth embodiment of the invention.
Figure 8A:
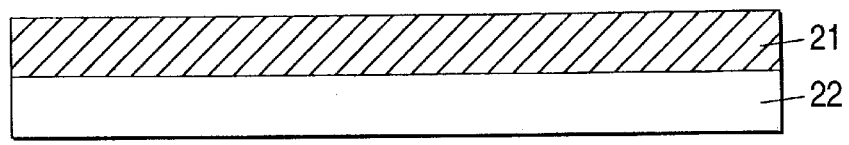
FIGS. 8A through 8C are sectional views for a description of manufacturing steps according to a conventional pattern forming method.
Figure 8B:
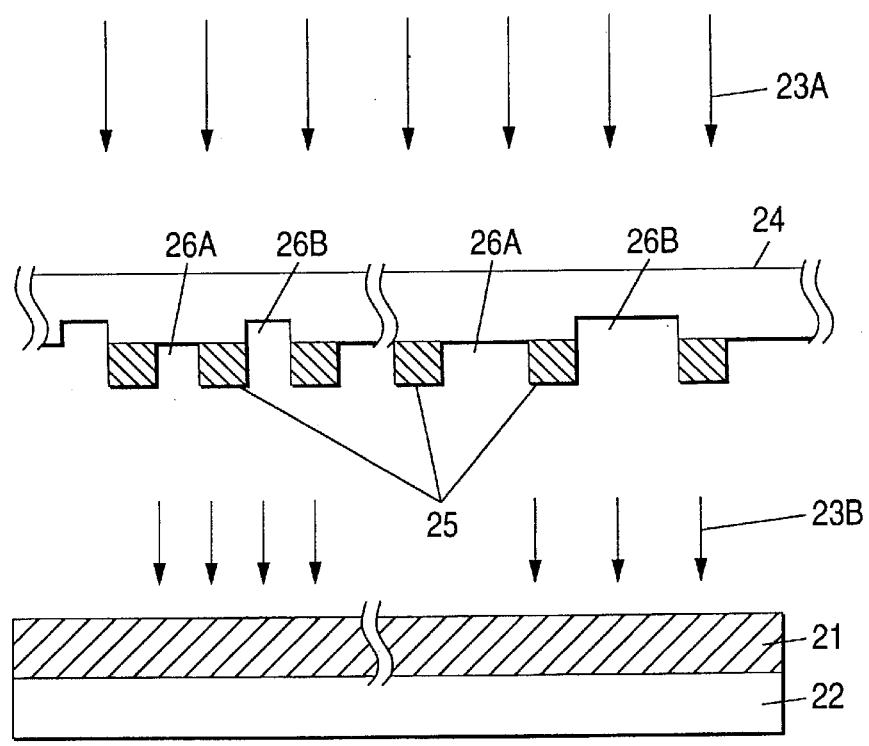
Figure 8C:
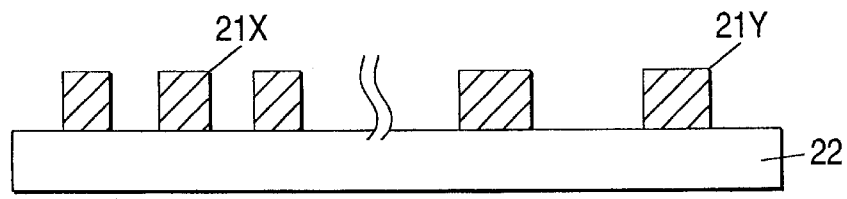

In those figures, reference numeral 15 designates opaque regions; and 16, 16A and 16B, transparent regions. The transparent region 16B inverts the phase of exposure light 180° with respect to the transparent region 16A. Reference character 1A denotes resist patterns formed. FIG. 7 is a graphical representation indicating the gradient of intensity distribution of light with the widths of the transparent region of the phase-shifting mask of the invention changed in width.

A pattern forming method using the phase-shifting mask, the fourth embodiment, will be described while being compared with the conventional one.

In FIGS. 6A and 9A, the fine line patterns on the wafer is such that the adjacent pattern space is more than six times the line width. In the embodiment of the invention, in the region where the adjacent pattern space is more than a predetermined value (six times the line width), as shown in FIG. 6A a predetermined limit width x is provided for the transparent regions 16A and 16B; that is, regions which are different 180° in phase from each other are provided as a pair, so as not to increase the transparent regions.

On the other hand, the conventional mask of FIG. 9A has no such a predetermined width, and therefore all the spaces between adjacent patterns are the transparent regions 16A and 16B. Hence, in the patterns spaced wide, the transparent regions are different depending on the pattern spaces, and therefore the line width is liable to change.

In the phase-shifting mask shown in FIG. 6A, transparent regions are provided on both side of an isolated pattern of the opaque region, and therefore another opaque region is formed at the middle of the mask. Hence, no light is applied to the region through which light should be transmitted; however, in the second exposure step of removing the upper and lower portion of the fine pattern, said region should be irradiated. When the mask (FIG. 6B) used for the second exposure in the embodiment is compared with the conventional mask (FIG. 9B), it can be understood that the portion of the shift phase mask which corresponds to the opaque region between the isolated patterns is the transparent region.

In the case where, as shown in 6A, in the phase-shifting mask, the particular transparent region width is set to x, even if the pattern spaces differs, the intensity of light passing through the transparent region is not changed; that is, resist patterns can be formed with high accuracy. On the other hand, in the conventional phase-shifting mask as shown in FIG. 9A, one transparent region is for two patterns. Hence, in designing the arrangement of patterns, it is always necessary to take the phase into consideration. On the other hand, in the case of FIG. 6 where one pattern covers a pair of right and left transparent regions, a mask can be designed independently of the phase of the transparent regions around the opaque region.

FIG. 7 is a graphical diagram indicating the slope of intensity distribution of light which is detected by simulation when, in an isolated pattern of 0.16 μm, the transparent region width x of the phase-shifting mask changes. In the graphical representation, the "y" axis represents the slope of intensity distribution of light for forming 0.16 μm; and the "x" axis represents values which are obtained by converting the mask's transparent region x on the wafer (x×the contraction magnification of the projection exposure device), and further normalized by λ/NA.

The simulation conditions are as follows: the exposure wave length λ=248 nm, the coherent factor σ=0.3, the curve a is of the numerical aperture NA=0.48, and the curve b is of the numerical aperture NA=0.60. It can be understood that the gradient of intensity distribution of light has a peak value with a particular transparent region width on the mask. In general, as the gradient of intensity distribution of light is large, the amount of exposure with respect to a dimension is large in margin. This fact is equivalent to the fact, even if the amount of exposure fluctuates in the pattern irradiation region, the dimensional fluctuation is decreased if the gradient of intensity distribution of light is large. Hence, it can be seen from the figure that, in order to increase the dimensional accuracy, it is preferable that the transparent region width x meets the following condition: 0.50 λ/NA≦(x X projection optical system contraction rate) ≦0.80 λ/NA The transparent region width of the phase-shifting mask of the invention was set to 0.65 λ/NA by dimensional conversion on the wafer, and the exposure was conducted with the stepper of the exposure wave length λ=248 nm, the numerical aperture NA=0.48, and the coherent factor σ0.30. The dimension of the resist thus formed was measured. With respect to the 0.16 μm line pattern which was large in pattern space, the dimensional accuracy was 0.16±10%.

As is apparent from the above description, by providing a particular width in the transparent region of the phase shifting mask, a pattern can be formed with high accuracy independently of the pattern space.

In the embodiment of the invention, the phase-shifting mask is obtained by grinding; however, it may be formed by laminating transparent films.

As was described above, in accordance with the distance between line widths, the width of the opaque region of the phase-shifting mask is changed, or a pattern space is set to a predetermined value or more, or the distance between the transparent regions is maintained constant at all times. Hence, the dimensional fluctuation is decreased which is due to the optical approach effect in the use of the phase-shifting mask.

What is claimed is:

1. A photo mask which is used to subject a resist to exposure to form a resist pattern, said photo mask comprising:

a plurality of opaque regions corresponding to the resist pattern to be formed; and alternating phase-shifting transparent regions on both sides of each opaque region, said transparent regions alternating in phase by 180° from one another;

wherein a line width of a first one of the opaque regions is reduced uniformly along a length of the first opaque region, the width being reduced as a function of a distance from the first opaque region to a second one of the opaque regions, the second opaque region being adjacent and parallel to the first opaque region.

2. A photo mask as claimed in claim 1, wherein said resist pattern includes line patterns, each line pattern having the same width regardless of a distance between adjacent line patterns.

3. A photo mask as claimed in claim 1, wherein the first opaque region forms a resist pattern of which an adjacent pattern space is of 0.7 $\lambda$/NA or more, and the second opaque region forms a resist pattern of which an adjacent pattern space is of 0.5 $\lambda$/NA or less, and widths of said first and second opaque regions are different from each other.

4. A photo mask which is used to subject a positive resist to exposure to form line patterns having an identical line width, said photo mask comprising:

a first opaque region and an adjacent second opaque region corresponding to a first line pattern and a second line pattern to be formed;

alternating phase-shifting transparent regions on both sides of said first and second opaque region, said transparent regions for each of said first and second opaque regions alternating in phase by 180° from one another; and a third opaque region located between the first and second adjacent opaque regions, and a distance from the first line pattern to the second line pattern is not less than a predetermined value.

5. A photo mask as claimed in claim 4, wherein a width x of said transparent region located between said first opaque region and said third opaque region satisfies the following condition:

0.5 $\lambda$/NA$\leq$(transparent region width x)×(projection optical system reduction magnification)$\leq$0.8 $\lambda$/NA.

6. A photo mask as claimed in claim 4, wherein said distance from the first line pattern to the second line pattern is not less than six times of the line width of the resist patterns.

7. A pattern forming method comprising the steps of:

subjecting a resist to exposure with a photo mask having a plurality of opaque regions to form a resist pattern corresponding to said plurality of opaque regions, said photo mask including alternating phase-shifting transparent regions on both sides of each opaque region, said transparent regions alternating in phase by 180° from one another; and reducing a line width of a first one of the opaque regions uniformly along a length of the first opaque region, the width being reduced as a function of a distance from the first opaque region to a second one of the opaque regions, the second opaque region being adjacent and parallel to the first opaque region.

8. A resist pattern forming method as claimed in claim 7, wherein said resist pattern includes line patterns, each line pattern having the same width regardless of a distance between adjacent line patterns.

9. A resist pattern forming method as claimed in claim 8, wherein the first opaque region forms a resist pattern of which an adjacent pattern space is of 0.7 $\lambda$/NA or more, and the second opaque region forms a resist pattern of which an adjacent pattern space is of 0.5 $\lambda$/NA or less, and widths of said first and second opaque regions are different from each other.

10. A pattern forming method as claimed in claim 7, wherein the distances between all adjacent resist patterns are at least 0.65 $\lambda$/NA.

11. A pattern forming method comprising the steps of:

subjecting a positive resist to exposure with a photo mask to form line patterns having an identical line width, said photo mask including a first opaque region and an adjacent second opaque region and alternating phase-shifting transparent regions on both sides of said first and second opaque regions, said transparent regions for each of said first and second opaque regions alternating in phase by 180° from one another;

wherein said photo mask further including a third opaque region located between the first and second adjacent opaque regions, said first and second opaque regions forming a first line pattern and a second line pattern and a distance from the first line pattern to the second line pattern is not less than a predetermined value.

12. A pattern forming method as claimed in claim 11, wherein a width x of said transparent region located between said first opaque region and said third opaque region meets the following condition:

0.5 $\lambda$/NA$\leq$(transparent region width x)×(projection optical system reduction magnification)$\leq$0.8 $\lambda$/NA.

13. A semiconductor manufacturing method comprising the steps of:

coating positive resist on a semiconductor substrate;

subjecting the resist to exposure with a photo mask having a plurality of opaque regions to form a resist pattern corresponding to said plurality of opaque regions, said photo mask including alternating phase-shifting transparent regions on both sides of each opaque region, said transparent regions alternating in phase by 180° from one another;

reducing a line width of a first one of the opaque regions uniformly along a length of the first opaque region, the width being reduced as a function of a distance from the first opaque region to a second one of the opaque regions, the second opaque region being adjacent and parallel to the first opaque region;

exposing the resist a second time using a second exposure mask to form resist portions necessary for a circuit pattern and to remove unnecessary resist patterns; and developing said resist patterns thus exposed.

14. A semiconductor manufacturing method comprising the steps of:

coating positive resist on a semiconductor substrate;

exposing said resist by using a photo mask in which alternating phase-shifting transparent regions are located on both sides of each of a first opaque region and a second opaque region, the transparent regions for each of said first and second opaque regions alternating in phase by 180° from one another, and a third opaque region is provided between the first and second opaque regions, and a distance from the first opaque region to the second opaque region is not less than a predetermined value;

exposing the resist a second time by using a second exposure mask to form portions necessary for a circuit pattern and to remove unnecessary resist patterns including resist patterns corresponding to said third opaque region; and developing said resist patterns thus exposed.

* * * * *

UNITED STATES PATENT AND TRADEMARK OFFICE
CERTIFICATE OF CORRECTION

PATENT NO.   : 5,994,002
DATED        : November 30, 1999
INVENTOR(S)  : Matsuoka It is certified that error appears in the above-indentified patent and that said Letters Patent is hereby corrected as shown below:

Column 2, Line 18, delete "a" and insert --$\sigma$--.

Column 2, Line 31, before "In" begin new paragraph.

Column 5, Line 11, after "dimension)." begin new paragraph.

Column 6, Line 13, delete "0.16" and insert --0.67--.

Column 6, Line 16, delete "0.16" and insert --0.67--.

Column 6, Line 19, delete "0.16" and insert --0.67--.

Column 6, Line 46, delete "a" (second occurrence) and insert --$\sigma$--.

Signed and Sealed this

Eighth Day of August, 2000

Attest:

Attesting Officer

Q. TODD DICKINSON
Director of Patents and Trademarks